(12) United States Patent
Chang et al.

(10) Patent No.: US 11,328,950 B2
(45) Date of Patent: May 10, 2022

(54) THIN GLASS OR CERAMIC SUBSTRATE FOR SILICON-ON-INSULATOR TECHNOLOGY

(71) Applicant: CORNING INCORPORATED, Corning, NY (US)

(72) Inventors: Ya-Huei Chang, Zhudong Township (TW); Jen-Chieh Lin, Horseheads, NY (US); Jian-Zhi Jay Zhang, Ithaca, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 17/153,041

(22) Filed: Jan. 20, 2021

(65) Prior Publication Data

US 2021/0225693 A1 Jul. 22, 2021

Related U.S. Application Data

(60) Provisional application No. 62/964,274, filed on Jan. 22, 2020.

(51) Int. Cl.
*H01L 21/762* (2006.01)
*H01L 29/24* (2006.01)
(Continued)

(52) U.S. Cl.
CPC .. *H01L 21/76251* (2013.01); *H01L 21/02422* (2013.01); *H01L 21/304* (2013.01); *H01L 21/4807* (2013.01); *H01L 29/24* (2013.01)

(58) Field of Classification Search
CPC ......... H01L 21/76251; H01L 21/02422; H01L 21/304; H01L 21/4807; H01L 29/24; H01L 21/2007; H01L 21/7806
See application file for complete search history.

(56) References Cited

U.S. PATENT DOCUMENTS 5,159,413 A 10/1992 Fujii et al.
10,155,667 B2 12/2018 Badding et al.
(Continued)

FOREIGN PATENT DOCUMENTS

EP 2332170 B1 6/2019

OTHER PUBLICATIONS

Miao et al., "Glass-SOI-Based Hybrid-Bonded Capacitive Micromachined Ultrasonic Transducer With Hermetic Cavities for Immersion Applications", Journal of Microelectromechanical Systems, vol. 25, No. 5, Oct. 2016, pp. 976-986.

*Primary Examiner* — John P. Dulka
(74) *Attorney, Agent, or Firm* — Russell S. Magaziner

(57) ABSTRACT

Embodiments of the disclosure relate to a method for fabricating semiconductor-on-insulator (SemOI) electronic components. In the method, a device wafer is bonded to a handling wafer. The device wafer includes a semiconductor device layer and a buried oxide layer. A substrate is adhered to the handling wafer. The substrate is a glass or a ceramic, and bonding occurs at an interface between the semiconductor device layer and the substrate. Material is removed from the device wafer to expose the buried oxide layer. The substrate is debonded from the handling wafer so as to provide an SemOI electronic component including the substrate, the semiconductor device layer, and the buried oxide layer.

20 Claims, 3 Drawing Sheets

(51) Int. Cl.
   *H01L 21/304* (2006.01)
   *H01L 21/02* (2006.01)
   *H01L 21/48* (2006.01)

(56) References Cited

U.S. PATENT DOCUMENTS

| | | |
|---|---|---|
| 10,581,115 B2 | 3/2020 | Badding et al. |
| 10,766,165 B2 | 9/2020 | Badding et al. |
| 2017/0084531 A1* | 3/2017 | Gu .................... H01L 21/76877 |

* cited by examiner

THIN GLASS OR CERAMIC SUBSTRATE FOR SILICON-ON-INSULATOR TECHNOLOGY

CROSS-REFERENCE TO RELATED APPLICATIONS

This application claims the benefit of priority under 35 U.S.C. § 119 of U.S. Provisional Application Ser. No. 62/964,274 filed on Jan. 22, 2020, the content of which is relied upon and incorporated herein by reference in its entirety.

BACKGROUND

The disclosure relates generally to semiconductor-on-insulator electronic components and methods of fabricating same. Recent advancements in 5G communications and the internet-of-things has created a need for high performance electronic components capable of operating in high frequency domains. In particular, such devices should provide high signal linearity and low loss as well as low power consumption. Conventional devices are limited by parasitic capacitance and current leakage that creates signal nonlinearity and loss, which prevents continued downscaling of devices and increases power consumption.

SUMMARY

In one aspect, embodiments of the disclosure relate to a method for fabricating semiconductor-on-insulator (SemOI) electronic components. In the method, a device wafer is bonded to a handling wafer. The device wafer includes a semiconductor device layer and a buried oxide layer. A substrate is adhered to the handling wafer. The substrate is a glass or a ceramic, and bonding occurs at an interface between the semiconductor device layer and the substrate. Material is removed from the device wafer to expose the buried oxide layer. The substrate is debonded from the handling wafer so as to provide an SemOI electronic component including the substrate, the semiconductor device layer, and the buried oxide layer.

In another aspect, embodiments of the disclosure relate to an SemOI electronic component. The SemOI electronic component includes a ceramic substrate, a buried oxide layer, and a semiconductor device layer disposed between the buried oxide layer and the ceramic substrate. The ceramic substrate has a thickness of 120 µm or less.

In still another aspect, embodiments of the disclosure relate to a method for fabricating SemOI electronic components. In the method, an oxide film is formed on a glass substrate. The glass substrate is adhered to a handling wafer. A device wafer is bonded to the handling wafer. The device wafer comprises a semiconductor device layer and a buried oxide layer. Bonding occurs at an interface between the semiconductor device layer and the oxide film of the glass substrate. Material is removed from the device wafer to expose the buried oxide layer. The substrate is debonded from the handling wafer so as to provide an SemOI electronic component including the glass substrate, the oxide film, the semiconductor device layer, and the buried oxide layer.

Additional features and advantages will be set forth in the detailed description that follows, and, in part, will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims.

BRIEF DESCRIPTION OF THE DRAWINGS

The accompanying drawings are included to provide a further understanding and are incorporated in and constitute a part of this specification. The drawings illustrate one or more embodiment(s), and together with the description serve to explain principles and the operation of the various embodiments. In the drawings.

DETAILED DESCRIPTION

Embodiments of the present disclosure relate to a method of fabricating semiconductor-on-insulator (SemOI) electronic components having a thin glass or ceramic substrate. The glass or ceramic substrate enhances signal linearity and substantially reduces or eliminates parasitic capacitances associated with conventional electronic components. Further, as compared to certain conventional glass substrates, the ceramic substrates provide enhanced thermal and mechanical properties, improving the robustness of the electronic components in which they are incorporated, while also matching or exceeding the advantages in terms of cost over silicon substrates. In the method, the glass or ceramic substrate is temporarily adhered to a typical semiconductor (e.g., silicon) handling wafer, allowing for ease in implementation of the thin substrate in existing processing lines. By contrast, certain conventional fabrication processes using a glass handling wafer may require lengthy preparation steps to provide a handling wafer that can be used with conventional fabrication equipment.

According to the presently disclosed method, the ceramic substrate is bonded to a device wafer. Upon bonding the thin substrate to the device wafer, the thin substrate can simply be debonded from the handling wafer without the requirement of grinding the substrate down to an acceptable thickness as in conventional methods using a semiconductor or glass wafer. Advantageously, in the presently disclosed method, the handling wafer can be reused by simply adhering another substrate thereto. As such, the presently disclosed method provides electronic components with superior electrical properties, especially in terms of signal linearity, while also reducing the complexity, time, and cost and increasing yield of the fabricating process. These and other aspects and advantages will be discussed in relation to the exemplary embodiments described herein and shown in the figures. These embodiments are presented by way of example only and not by way of limitation.

Figure 1:
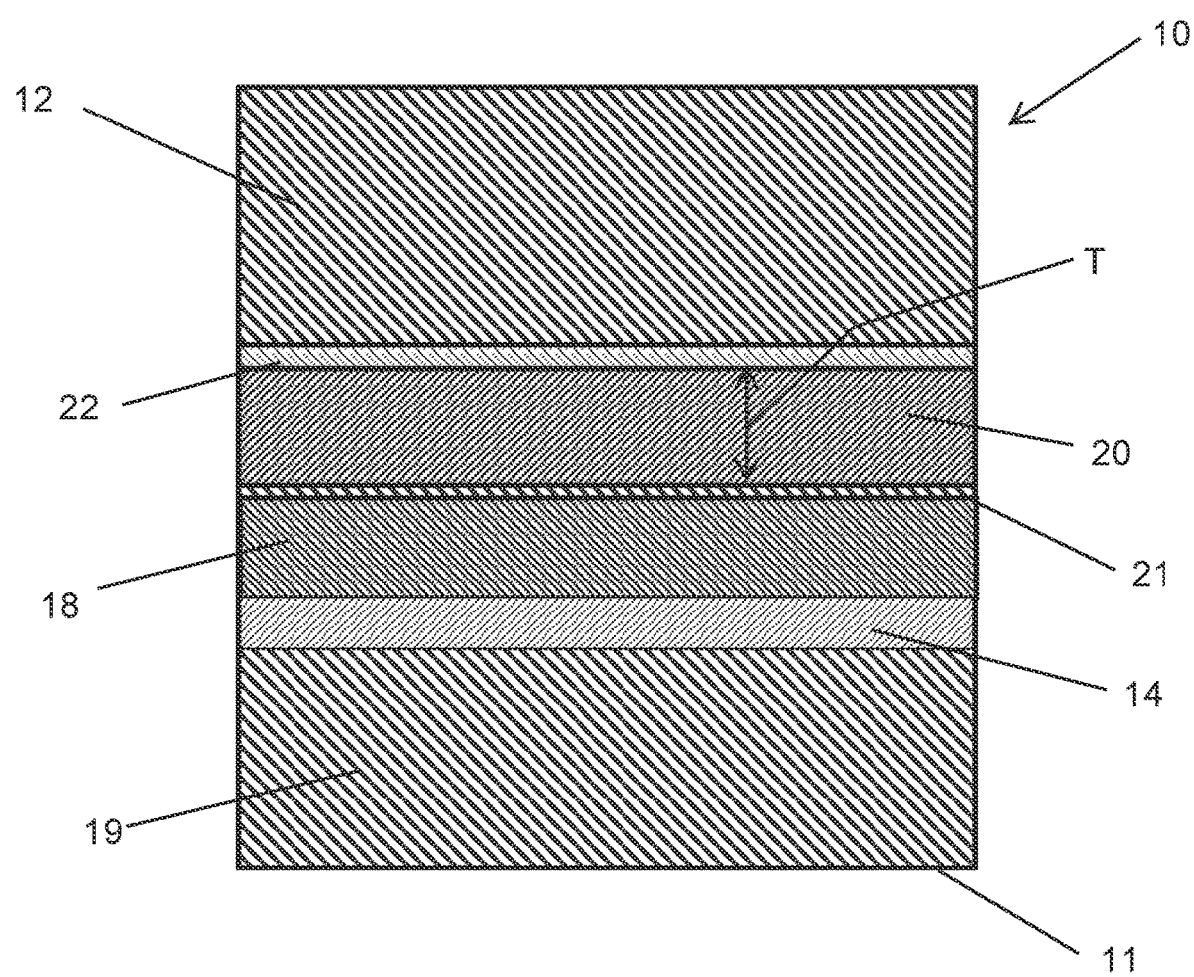
FIG. 1 schematically depicts a bonded wafer structure, according to an exemplary embodiment.

FIG. 1 schematically depicts an embodiment of a wafer-bonded structure 10. In the following discussion of the method of fabricating a SemOI electronic components, reference will be made to the structural layers shown in FIG. 1. The wafer-bonded structure 10 includes a device wafer 11 and a handling wafer 12. In embodiments, the device wafer 11 is a prefabricated, layered wafer comprising a layer of semiconductor electronic devices. As shown in FIG. 1, the device wafer 11 includes a buried oxide layer 14 and a semiconductor device layer 18. The device wafer 11 includes a bulk region 19, and the buried oxide layer 14 is disposed between the bulk region 19 and the semiconductor device layer 18. As discussed below, the bulk region 19 may be mechanically ground to a thickness of 50 µm or less and then completely removed through etching. In this way, the buried oxide layer 14 acts as an etch-stop.

The device wafer 11 is bonded to a substrate 20. As depicted in the embodiment of FIG. 1, an oxide film 21 is provided between the substrate 20 and semiconductor device layer 18. The oxide film 21 may provide chemical compatibility between these layers while also providing relatively smooth surfaces to join the layers. In embodiments, the thickness of the oxide film 21 is 1 µm or less. In embodiments, the substrate 20 is thin, e.g., having a thickness T of 120 µm or less, 80 µm or less, or 50 µm or less. In embodiments, the substrate 20 has a thickness T of at least 40 µm. The substrate 20 is adhered to the handling wafer 12 using a temporary adhesive 22. By "temporary," it is meant that the adhesive is strong enough to keep the handling wafer 12 bonded to the substrate 20 during performance of the method described below but not so strong as to destroy either the substrate 20 or the handling wafer 12 when separating the two after performance of the method described herein.

In embodiments, the substrate 20 is a glass or ceramic material. In embodiments, the substrate 20 is sintered alumina, silica, partially-stabilized or fully-stabilized zirconia, a titanate, or another ceramic material. Such thin ceramic substrates are commercially available from Corning Incorporated, Corning, N.Y. In embodiments in which a ceramic is used, the substrate 20 has an elastic modulus of at least 100 GPa, an edge strength of at least 200 MPa, and/or a thermal conductivity of at least 30 W/mK. In other embodiments, the substrate 20 is a glass material, such as borosilicate glass (e.g., CORNING® WILLOW® GLASS, available from Corning Incorporated, Corning, N.Y.) or fused silica (e.g., CORNING® HPFS® Fused Silica Glass available from Corning Incorporated, Corning, N.Y.). In embodiments of either the glass or ceramic substrate 20, the substrate 20 has, at frequencies up to 60 GHz, a dielectric constant of 10 or less and/or a loss tangent of 0.01 or less.

As mentioned, the substrate 20 is adhered to the handling wafer 12 using a temporary adhesive 22. Exemplary temporary adhesives 22 that can be used to adhere the substrate 20 to the handling wafer 12 include commercially available adhesives from Brewer Science, Inc. (e.g., BREWER-BOND® or WAFERBOND® adhesives), 3M (e.g., 3M™ LC-Series Liquid Curable Adhesives), or Tokyo Ohka Kogyo Co., Ltd., among others.

Figure 2:
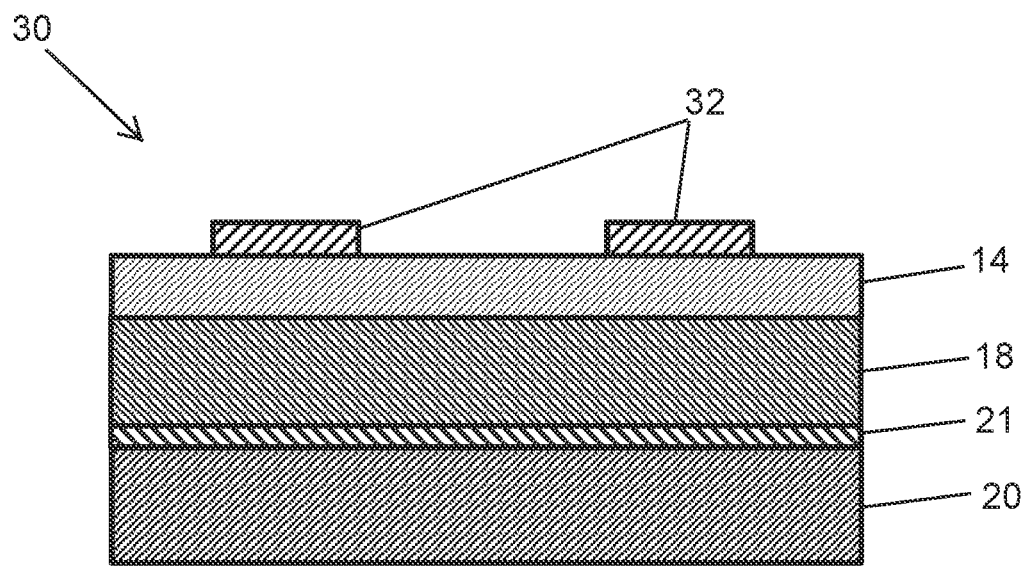
FIG. 2 schematically depicts an electronic component mounted on a ceramic substrate formed from the bonded wafer structure according to FIG. 1, according to an exemplary embodiment.

FIG. 2 schematically depicts an exemplary embodiment of a SemOI electronic component 30 having a substrate 20 as described above. In particular, the SemOI electronic component 30 has had the bulk region 19 and the handling wafer 12 removed. As with FIG. 1, reference may be made to the SemOI electronic component 30 of FIG. 2 and its elements in the discussion of the method of fabrication provided below. The electronic component 30 may be any of a variety of electronic components, such as a transistor, radio-frequency components, and/or silicon photonic devices. In general, the electronic component 30 is formed in the semiconductor device layer 18. For example, the semiconductor device layer 18 may be configured as a MOSFET in which various materials are formed or deposited in the semiconductor device layer 18, such as a gate, a source, a drain, insulating layers, and semiconducting bodies. For example, semiconductor device layer 18 may contain various p-type semiconductor materials, n-type semiconductor materials, polysilicon layers, conductor layers, dielectric layers, etc. As can be seen in FIG. 2, the SemOI electronic component 30 may also include redistribution layers 32 formed over the buried oxide layer 14. Further, while the depiction of the SemOI electronic component is relatively simplistic and schematic, the semiconductor device layer 18 may include multiple electronic components, including multiple kinds of electronic components and/or integrated circuits within the semiconductor device layer 18, that can be diced into individual pieces.

Figure 3:
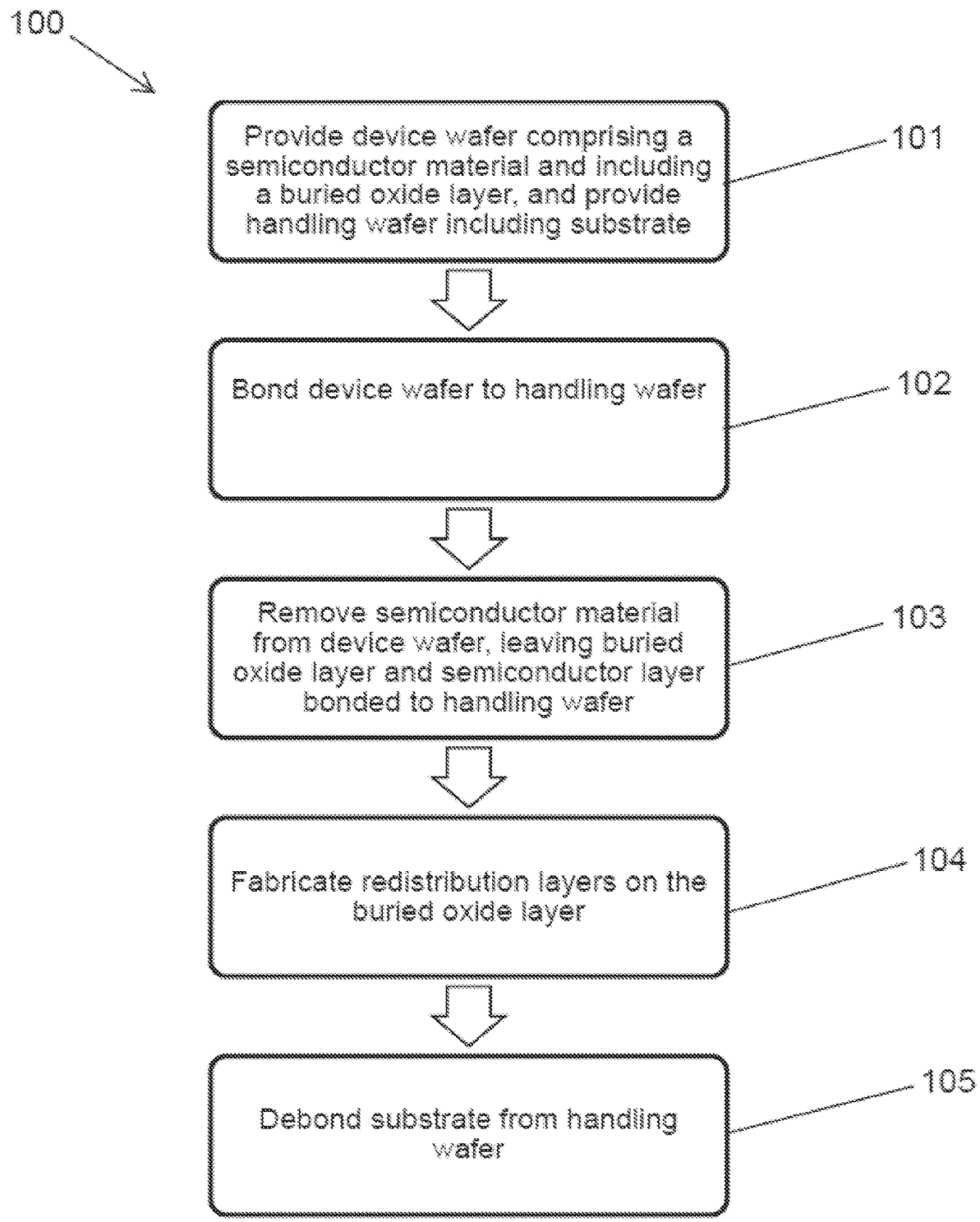
FIG. 3 is a flow diagram of a method of fabricating an electronic component of FIG. 2 using the bonded wafer structure according to FIG. 1, according to an exemplary embodiment.

Having described the wafer bonded structure 10 of FIG. 1 and the SemOI electronic component 30 of FIG. 2, a method of fabricating the SemOI electronic component 30 from the wafer bonded structure 10 is described in relation to the flow diagram of FIG. 3. In a first step 101, the device wafer 11 and the handling wafer 12 are provided. In particular, the handling wafer 12 is provided with the substrate 20 adhered thereto using the temporary adhesive 22. Further, the device wafer 11 includes the buried oxide layer 14 and the semiconductor device layer 18. In embodiments, the composition of the buried oxide layer 14 depends on the particular semiconductor material used in the bulk region 19. In embodiments, the device wafer 11 comprises a semiconductor material, such as silicon, germanium, gallium arsenide, or gallium nitride, among others. In embodiments, the buried oxide layer 14 is silica ($SiO_2$), germanium oxide ($GeO_2$), or another oxide of the semiconductor material.

In a second step 102, the device wafer 11 is bonded to the handling wafer 12. In particular, the wafers 11, 12 are bonded at an interface between the semiconductor device layer 18 and the substrate 20. In order to bond the semiconductor device layer 18 to the substrate 20, the surfaces of one or both the semiconductor device layer 18 and the substrate 20 may undergo surface treatment steps to facilitate bonding, such as providing an oxide film, chemical-mechanical polishing (CMP), and/or a surface activation process (e.g., plasma treatment or RCA clean (SC1+SC2)). The activation process may be used to remove particles and enhance bonding energy at lower temperature.

In an embodiment, one or both of the semiconductor device layer 18 and the substrate 20 may be provided with an oxide film 21 followed by CMP, e.g., to remove surface roughness or porosity that might hinder bonding. In an embodiment, one or both of the semiconductor device layer 18 and the substrate 20 may be subjected to CMP only before bonding. In an embodiment, one or both of the semiconductor device layer and the substrate 20 may undergo a first CMP followed by formation of an oxide film 21, which is followed by a second CMP.

In embodiments in which an oxide film 21 is formed, the substrate 20 and/or semiconductor device layer 18 may be provided with an oxide film 21 compatible with the other of the semiconductor device layer 18 or the substrate 20 to facilitate bonding between the two, e.g., depositing a layer of $SiO_2$ on a glass substrate 20 to facilitate bonding with an Si semiconductor device layer 18. In embodiments, the oxide film deposited on each of the substrate 20 and/or semiconductor device layer 18 is 0.5 µm or less, and the total oxide film upon bonding the substrate 20 and the semiconductor device layer 18 is 1 µm or less. However, if the substrate 20 is already compatible with the semiconductor device layer 18, then the oxide deposition may not be necessary (e.g., depending on other surface preparation steps). Other combinations where oxide film deposition would not be necessary include, e.g., $Al_2O_3$ substrate 20 and Si semiconductor device layer 18.

During bonding, the wafers 11, 12 are pressed together, optionally at elevated temperatures. In embodiments, the bonding takes place at a temperature in the range of room temperature (e.g., as low as 20° C.) to 350° C. In other embodiments, the bonding takes place at room temperature, and then the bonded structure may be annealed, e.g., at a temperature of up to 350° C.

In a third step 103, the bulk region 19 of semiconductor material of the device wafer 11 is removed, leaving behind the buried oxide layer 14 and the semiconductor device layer 18 bonded to the substrate 20. In embodiments, the device wafer 11 may be ground down, e.g., to a thickness of 50 µm or less, to remove the unused bulk region 19. In embodiments, the bulk region 19 undergoes etching to remove the remainder of the bulk region 19 completely. In an embodiment, an etchant comprising tetramethylammonium hydroxide (TMAH) is used to remove the bulk region 19, using the buried oxide layer 14 as an etch-stop.

In a fourth step 104, redistribution layers 32 are fabricated over the buried oxide layer 14. The fabrication may involve various masking, etching, and deposition techniques to provide the redistribution layers 32. In general, the maximum processing temperature of the redistribution layers is 400° C., which is below the maximum operating temperature of the substrate 20 (e.g., 500° C. or more).

In a fifth step 105, the substrate 20 is debonded from the handling wafer 12. In embodiments, the substrate 20 is debonded using a laser lift off process. For example, if a silicon handling wafer 12 is used, the wavelength of the laser may be about 1.5 µm as silicon is transparent to a laser at this wavelength. As such, the laser can be used to disrupt the temporary adhesive layer 22. In other embodiments, the handling wafer 12 can be debonded from the substrate 20 using (thermal-) mechanical debonding. In still other embodiments, the handling wafer 12 can be debonded using ultraviolet irradiation. The handling wafer 12 can then be reused in the fabrication method 100 by adhering another substrate 20.

The disclosed process has several advantages over conventional processes for fabricating SemOI electronic components. A first advantage relates to the simplification of the process in the preparatory and finishing stages. According to one conventional method, glass is used as the handling wafer. However, glass has several issues in terms of compatibility with conventional SemOI processing equipment. For example, the high transparency of the glass makes it difficult for sensors to recognize the glass wafer, and further, the glass material is not usable with an electrostatic chuck. Accordingly, in the conventional process using a glass handling wafer, doped silicon films are deposited on the glass, and the glass is passivated in order to allow it bond with the device wafer without introducing contaminants that may be part of the glass chemical makeup. By using a substrate 20 adhered to a typical silicon handling wafer 12, no modifications need to be made to use the substrate 20 with conventional processing equipment, eliminating a significant amount of preparatory work for the handling wafer 12.

Additionally, the use of the substrate 20 provides significant time-savings on the back end of the process as well because the handling wafer 12 can simply be removed substrate 20 by debonding the temporary adhesive 22. Using a conventional glass handling wafer requires significant grinding to thin the glass to a finished substrate level, e.g., to about 150 µm, for the electronic component, and because the grinding consumes the unused portion of the glass handle wafer, preparation of another glass handling wafer is necessary. In contrast, the substrate 20 allows for the same handling wafer 12 to be used over and over by simply adhering a new substrate 20 to the handling wafer 12 for each use.

Notwithstanding, the substrate 20 provides the same or better electrical and mechanical properties associated with glass over conventional silicon handling wafers. Moreover, as compared to glass, the ceramic substrate has better thermal conductivity. Semiconductor substrates formed from a semiconductor handling wafer experience signal loss, current leakage, high nonlinearity in RF devices, and parasitic capacitance with the SemOI electronic component. Glass has been used as the substrate to address these because glass is an insulator, providing greater signal linearity and less loss than semiconductor substrates (e.g., silicon substrates). However, as discussed above, preparing a SemOI electronic component on glass has certain processing drawbacks. Using a thin glass or ceramic substrate 20 as disclosed herein, not only are the electronic properties associated with using an insulating material as the substrate maintained, but also, the mechanical properties of the substrate are improved, especially when ceramic substrates 20 are used.

For example, an alumina ceramic substrate 20 may have a thermal conductivity of up to 36 W/mK. By contrast, a glass substrate formed from a glass handling wafer may have a thermal conductivity of around 1 W/mK. Further, the elastic modulus of a ceramic substrate 20 is about three times higher than a glass substrate formed from conventional glass handling wafers. In embodiments, the elastic modulus of the ceramic substrate 20 is at least at least 200 GPa or at least 390 GPa. Additionally, in embodiments, the edge strength of the ceramic substrate may be at least as high as 200 MPa and up to 600 MPa, and in combination with the higher modulus, the SemOI electronic component 30 formed from the substrate 20 is overall more mechanically robust after dicing. Further, regarding electrical properties, an alumina ceramic substrate 20 has a dielectric loss as low as 0.0001 up to 60 GHz, which makes it suitable for use in fabricating RF SemOI electronic components. Additionally, the dielectric constant for an alumina ceramic substrate 20 can be as low as 10 at 60 GHz, which provides higher insulation capability and less parasitic capacitance than conventional substrates.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred. In addition, as used herein, the article "a" is intended to include one or more than one component or element, and is not intended to be construed as meaning only one.

It will be apparent to those skilled in the art that various modifications and variations can be made without departing from the spirit or scope of the disclosed embodiments. Since modifications, combinations, sub-combinations and variations of the disclosed embodiments incorporating the spirit and substance of the embodiments may occur to persons skilled in the art, the disclosed embodiments should be construed to include everything within the scope of the appended claims and their equivalents.

What is claimed is:

1. A method for fabricating semiconductor-on-insulator (SemOI) electronic components, the method comprising the steps of:
   bonding a device wafer to a handling wafer, wherein the device wafer comprises a semiconductor device layer and a buried oxide layer, wherein a substrate is adhered to the handling wafer, wherein the substrate is a glass or a ceramic, and wherein bonding occurs at an interface between the semiconductor device layer and the substrate;
   removing material from the device wafer to expose the buried oxide layer; and
   debonding the substrate from the handling wafer so as to provide a SemOI electronic component comprising the substrate, the semiconductor device layer, and the buried oxide layer.

2. The method of claim 1, further comprising a step of selecting the substrate to comprise at least one of an alumina, a silica, a zirconia, or a titanate.

3. The method of claim 2, wherein the substrate has at least one of an elastic modulus of at least 200 GPa or an edge strength of at least 200 MPa.

4. The method of claim 1, further comprising a step of selecting the substrate to comprise borosilicate glass or fused silica.

5. The method of claim 1, wherein the substrate has a thickness of 40 μm to 120 μm.

6. The method of claim 1, further comprising a step of selecting the semiconductor material to comprise silicon, germanium, gallium arsenide, or gallium nitride.

7. The method of claim 6, further comprising a step of selecting the buried oxide layer to comprise silica, germanium dioxide, or alumina.

8. The method of claim 1, wherein the step of debonding comprises removing the handling wafer using laser liftoff.

9. The method of claim 1, wherein the step of removing further comprises grinding the device wafer and etching with an etchant comprising tetramethylammonium hydroxide.

10. The method of claim 1, further comprising a step of fabricating redistribution layers over the buried oxide layer.

11. The method of claim 1, further comprising a step of forming an oxide film over one or both of the semiconductor device layer and the substrate and wherein, after the step of bonding, a total thickness of the oxide film applied to one or both of the semiconductor device layer and the substrate is 1 μm or less.

12. A semiconductor-on-insulator (SemOI) electronic component, comprising:
    a ceramic substrate;
    a buried oxide layer; and
    a semiconductor device layer disposed between the buried oxide layer and the ceramic substrate;
    wherein the ceramic substrate has a thickness of 120 μm or less.

13. The SemOI electronic component of claim 12, further comprising an oxide film disposed between the ceramic substrate and the semiconductor device layer, wherein the oxide film has a thickness of 1 μm or less.

14. The SemOI electronic component of claim 12, wherein the ceramic substrate comprises at least one of an alumina, a zirconia, or a titanate.

15. The SemOI electronic components of claim 12, wherein the semiconductor device layer comprises silicon, germanium, gallium arsenide, or gallium nitride.

16. The SemOI electronic components of claim 15, wherein the buried oxide layer comprises silica, germanium dioxide, or alumina.

17. The SemOI electronic component of claim 12, wherein the ceramic substrate has at least one of an elastic modulus of at least 200 GPa or an edge strength of at least 200 MPa.

18. The SemOI electronic components of claim 12, wherein the SemOI electronic component comprises at least one of a transistor, radio-frequency component, or a silicon photonic device.

19. A method for fabricating semiconductor-on-insulator (SemOI) electronic components, the method comprising the steps of:
    forming an oxide film on a glass substrate, wherein the glass substrate is adhered to a handling wafer;
    bonding a device wafer to the handling wafer, wherein the device wafer comprises a semiconductor device layer and a buried oxide layer and wherein bonding occurs at an interface between the semiconductor device layer and the oxide film of the glass substrate;
    removing material from the device wafer to expose the buried oxide layer; and
    debonding the substrate from the handling wafer so as to provide an SemOI electronic component comprising the glass substrate, the oxide film, the semiconductor device layer, and the buried oxide layer.

20. The method of claim 19, wherein glass substrate comprises at least one of a borosilicate glass or fused silica.

* * * * *